US 9,857,702 B2

(12) United States Patent
Song et al.

(10) Patent No.: US 9,857,702 B2
(45) Date of Patent: Jan. 2, 2018

(54) FOCUSING LEVELING DEVICE

(71) Applicant: SHANGHAI MICRO ELECTRONICS EQUIPMENT CO., LTD., Shanghai (CN)

(72) Inventors: Haijun Song, Shanghai (CN); Kan Lu, Shanghai (CN); Feibiao Chen, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 20 days.

(21) Appl. No.: 15/108,886

(22) PCT Filed: Dec. 24, 2014

(86) PCT No.: PCT/CN2014/094771
§ 371 (c)(1),
(2) Date: Jun. 29, 2016

(87) PCT Pub. No.: WO2015/101196
PCT Pub. Date: Jul. 9, 2015

(65) Prior Publication Data
US 2016/0327875 A1    Nov. 10, 2016

(30) Foreign Application Priority Data

Dec. 31, 2013  (CN) .......................... 2013 1 0747393

(51) Int. Cl.
G03F 7/20        (2006.01)
G03F 9/00        (2006.01)
(52) U.S. Cl.
CPC .......... G03F 9/7026 (2013.01); G03F 9/7034 (2013.01)

(58) Field of Classification Search
CPC ............................ G03F 9/7026; G03F 9/7034
See application file for complete search history.

(56) References Cited

U.S. PATENT DOCUMENTS

| 5,414,515 | A |   | 5/1995 | Kawashima |            |
|-----------|---|---|--------|-----------|------------|
| 5,602,400 | A | * | 2/1997 | Kawashima | G03F 9/7026 |
|           |   |   |        |           | 250/548    |
| 6,080,990 | A | * | 6/2000 | Watanabe  | G03F 9/7026 |
|           |   |   |        |           | 250/491.1  |

FOREIGN PATENT DOCUMENTS

| CN | 101169601 | 4/2008 |
| CN | 101201549 | 6/2008 |

(Continued)

*Primary Examiner* — Steven H Whitesell Gordon
(74) *Attorney, Agent, or Firm* — Muncy, Geissler, Olds & Lowe, P.C.

(57) ABSTRACT

A focusing and leveling apparatus, including: an illumination light source (201) for emanating a light beam; an illumination lens group (202), a projecting unit, an object (209) being measured, a detecting unit, a refractive unit, a relay lens group and a photoelectric detector (220), disposed sequentially in this order in a transmission path of the light beam. The projecting unit includes projection slits (203) defining a plurality of non-linearly arranged marks, such that after passing sequentially through the illumination lens group (202), the projecting unit, the object (209) being measured and the detecting unit, the light beam emanated by the illumination light source (201) becomes a plurality of non-linearly arranged sub-beams corresponding to the plurality of marks. The refractive unit is so configured that after passing through the refractive unit, the plurality of sub-beams form a plurality of linearly arranged light spots.

10 Claims, 4 Drawing Sheets

(56) References Cited

FOREIGN PATENT DOCUMENTS

| | | |
|---|---|---|
| CN | 101710291 | 5/2010 |
| KR | 100254253 | 5/2000 |
| TW | 200919104 | 5/2009 |

\* cited by examiner

FOCUSING LEVELING DEVICE

TECHNICAL FIELD

The present invention relates to photolithography and, more particularly, to an apparatus having a refractive unit for automatic focusing and leveling in a photolithography tool.

BACKGROUND

Current projection photolithography systems typically include an automatic focusing and leveling sub-system for accurately measuring a level and a tilt of the surface of an object. FIG. 1 is a schematic illustration of such a focusing and leveling system used in a conventional projection photolithography tool. As shown in FIG. 1, the focusing and leveling system includes a projection objective 19 and an optical measuring path extending on both sides of an optical axis of the projection objective 19. Disposed in the optical measuring path are an illuminating unit, a projecting unit, a detecting unit and a relay lens group arranged in this order. The illuminating unit is composed of an illumination light source 1, an illumination lens group 2 and fiber optics (not shown). Light emanated from the light source 1 is condensed by the illumination lens group 2 and directed through the fiber optics onto the projecting unit, thereby providing illuminating light to the whole measuring system. The projecting unit is composed of projection slits 3, an upstream projection lens group 4, a reflector group 5 and a downstream projection lens group 6. Light exiting the illuminating unit passes sequentially through the projection slits 3, the upstream projection lens group 4, the reflector group 5 and the downstream projection lens group 6, and then forms light spots to be measured in an exposure area on the surface of the object 7 being measured. The detecting unit is composed of an upstream detection lens group 8, a reflector group 9 and a downstream detection lens group 10. The relaying unit is disposed downstream relative to the detecting unit and is made up of a relay reflector 11, a relay lens group 12, a detector 13, a focusing controller 14 and an arithmetic unit 15. When travelling in the relaying unit, light forming the spots is received by the detector 13 and converted thereby to a light intensity signal indicative of the position and tilt of the surface of the object being measured.

As disclosed in one of its embodiments, the U.S. Pat. No. 5,414,515 provides a device with a single optical path and multiple light spots, in which, in order to achieve a measurement field of view having a required size, a plurality of charge-coupled devices (CCDs) is used. This design is disadvantageous in that the use of multiple CCDs, as wells as, corresponding image capture cards and cables, leads to high cost and increased footprint constraints on the whole photolithography tool in which the device is employed.

The Chinese patent CN101710291 discloses a solar energy device having a lens for refracting parallel light beams. This device differs from the subject matter of the present invention in terms of its application. CN101710291 focuses on the convergence of light beam energy and has no requirement on image quality. In contrast, the present invention is applied to imaging position adjustment and has requirements on resolution, distortion, focal depth and other image quality metrics. Therefore, there are essential differences between CN101710291 and the present invention.

SUMMARY OF THE INVENTION

It is an objective of the present invention to provide a novel structure for focusing and leveling sub-systems in projection photolithography tools, in which a refractive unit is introduced in an optical path, thereby satisfying the system requirements for a large field of view and multipoint measurement with a single optical path and a single CCD linear array and resulting in overall reductions in cost and footprint.

A focusing and leveling apparatus according to the present invention includes: an illumination light source for emanating a light beam; and an illumination lens group, a projecting unit, an object being measured, a detecting unit, a refractive unit, a relay lens group and a photoelectric detector, disposed sequentially in this order in a transmission path of the light beam. The photoelectric detector is configured to convert the light beam that has exited the relay lens group and carries information about a level and a tilt of the surface of the object being measured to an electrical signal and pass the electrical signal on to an arithmetic unit and a focusing and leveling controller. The arithmetic unit is configured to produce a control signal for the focusing and leveling controller based on the received electrical signal such that the focusing and leveling controller controls a wafer stage that supports the object being measured so as to adjust the level and tilt of the surface of the object being measured. The projecting unit includes projection slits defining a plurality of non-linearly arranged marks, such that after passing sequentially through the illumination lens group, the projecting unit, the object being measured and the detecting unit, the light beam emanated by the illumination light source becomes a plurality of non-linearly arranged sub-beams corresponding to the plurality of marks. The refractive unit is so configured that after passing through the refractive unit, the plurality of sub-beams form a plurality of linearly arranged light spots.

Preferably, the projection slits define at least three non-linearly arranged marks.

Preferably, the projecting unit further comprises a double-prism group having two prisms sandwiching the projection slits therebetween.

Preferably, the refractive unit comprises a reflector group, a lens group and a prism group.

Preferably, the reflector group consists of n−1 pairs of reflectors, the lens group consists of n lenses, and the prism group consists of n−1 prisms, where n corresponds to the number of the non-linearly arranged marks defined by the projection slits.

Preferably, the refractive unit further includes a parallel-sided plate, wherein a middle one of the plurality of sub-beams incident on the refractive unit passes through a corresponding one of the lenses and is then incident on the parallel-sided plate, with the remaining ones of the plurality of sub-beams traveling sequentially through corresponding pairs of the reflectors, corresponding ones of the lenses and prisms and then being incident, together with the middle sub-beam, on the relay lens group.

Preferably, the photoelectric detector is a single CCD linear array.

Preferably, the refractive unit includes two wedges disposed with their sloped faces facing each other.

Preferably, a first one of the two wedges defines first through-holes in its middle and lower parts at locations corresponding to incidence of the middle and lower ones of the plurality of sub-beams on the first wedge of the refractive unit, and a second one of the two wedges defines second through-holes in its middle and upper parts at locations corresponding to incidence of the middle and upper ones of the plurality of sub-beams on the second wedge of the refractive unit.

Preferably, the refractive unit further includes a parallel-sided plate so disposed that the middle one of the plurality of sub-beams passes through the first and second through-holes defined in the respective middle parts of the first and second wedges and is then incident on the parallel-sided plate.

Differing from the two schemes commonly adopted in the prior art, i.e., a first scheme having multiple optical paths and producing multiple light spots to be measured, in which a plurality of CCD linear arrays are used to meet the requirement for a large measurement field of view, and a second scheme having a single optical path and producing multiple light spots to be measured, in which a single CCD planar array is used to achieve a large measurement field of view, the present invention provides a novel structure for focusing and leveling sub-systems in projection photolithography tools, in which a refractive unit is introduced in an optical path, thereby satisfying the system requirements for a large field of view and multipoint measurement with a single optical path and a single CCD linear array and resulting in overall reductions in cost and footprint.

BRIEF DESCRIPTION OF THE DRAWINGS

The advantages and spirit of the invention will be better understood from the following detailed description when considered with reference to the accompanying drawings, in which.

DETAILED DESCRIPTION

Some specific Embodiments of the present invention will be described below with reference to the accompanying drawings.

Embodiment 1

Figure 1:
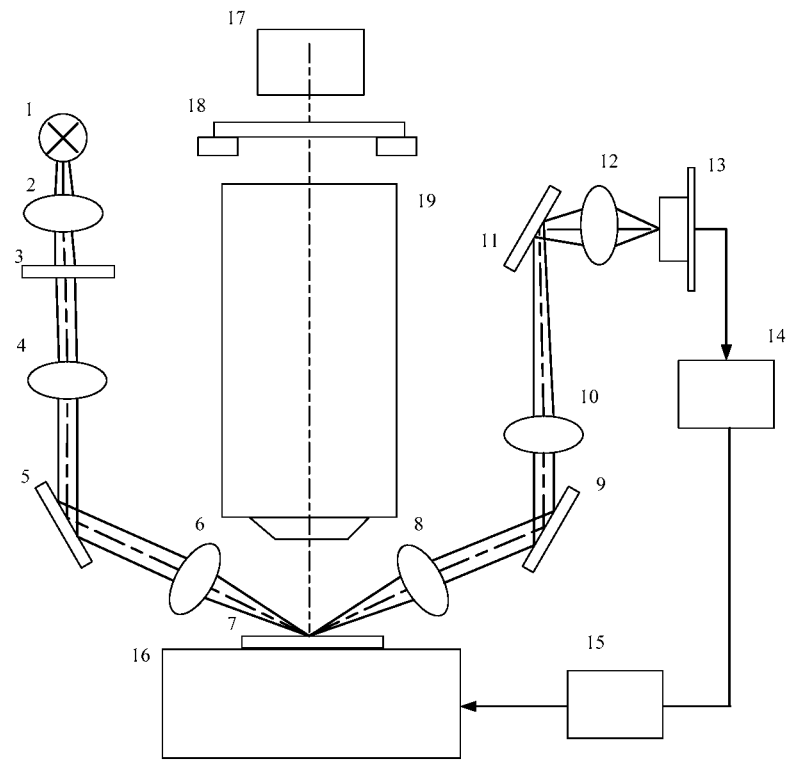
FIG. 1 is a schematic illustration of a focusing and leveling system of a projection photolithography tool.
Figure 2:
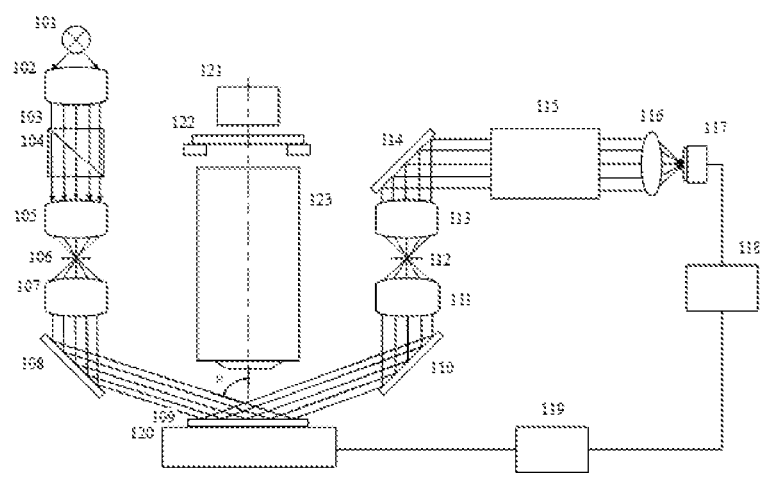
FIG. 2 schematically illustrates a focusing and leveling system having a refractive unit according to the present invention.

FIG. 2 schematically shows a focusing and leveling apparatus having a refractive unit for use in a projection photolithography tool according to the present invention. As illustrated, the apparatus comprises an illumination light source 101, an illumination lens group 102, projection slits 103, a double-prism group 104, an upstream projection lens group 105, a projection diaphragm 106, a downstream projection lens group 107, a projection reflector 108, an object 109 being measured, an upstream detection reflector 110, an upstream detection lens group 111, a detection diaphragm 112, a downstream detection lens group 113, a downstream detection reflector 114, a refractive unit 115, a relay lens group 116, a CCD linear array 117, a focusing controller 118, and an arithmetic unit 119. A light beam from the illumination light source 101 passes through the illumination lens group 102 and is then incident on the projection slits 103 which is sandwiched between the two prisms of the double-prism group 104. After exiting the double-prism group 104, sub-beams are generated and travel through the upstream projection lens group 105, the projection diaphragm 106 and the downstream projection lens group 107, and are then reflected by the projection reflector 108 onto the object 109. The object 109 then reflects the sub-beams onto the upstream detection reflector 110, which, in turn, reflects the sub-beams into the upstream detection lens group 111. After traveling through the upstream detection lens group 111, the sub-beams further propagate through the detection diaphragm 112 and the downstream detection lens group 113, and are then reflected by the downstream detection reflector 114 into the refractive unit 115. Upon exiting the refractive unit 115, the sub-beams form light spots distributed in a single linear field of view, and then further transmit through the relay lens group 116 and are received by the CCD linear array 117, where the light is subjected to photoelectric conversion and thereby results in a signal indicative of information about a level and a tilt of the surface of the object being measured. The signal is then passed by the focusing controller 118 on to the arithmetic unit 119, where the signal is processed to perform control over a wafer stage 120 such that the object 109 is adjusted in its surface level and tilt as desired.

Figure 3:
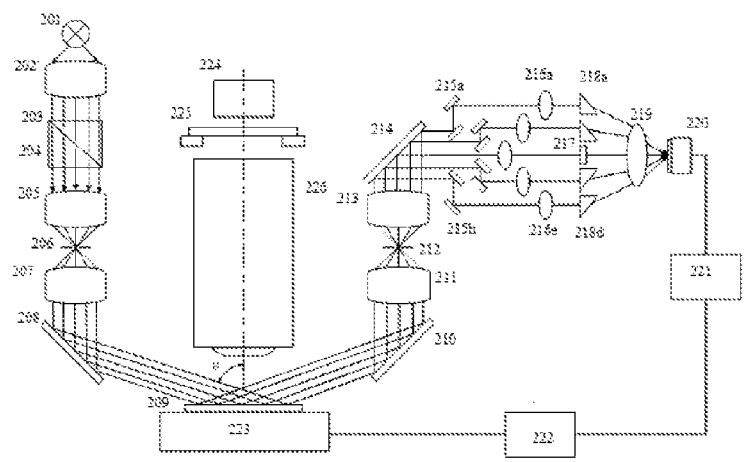
FIG. 3 schematically shows a focusing and leveling apparatus having a refractive unit with a reflector group according to the present invention.
Figure 4:
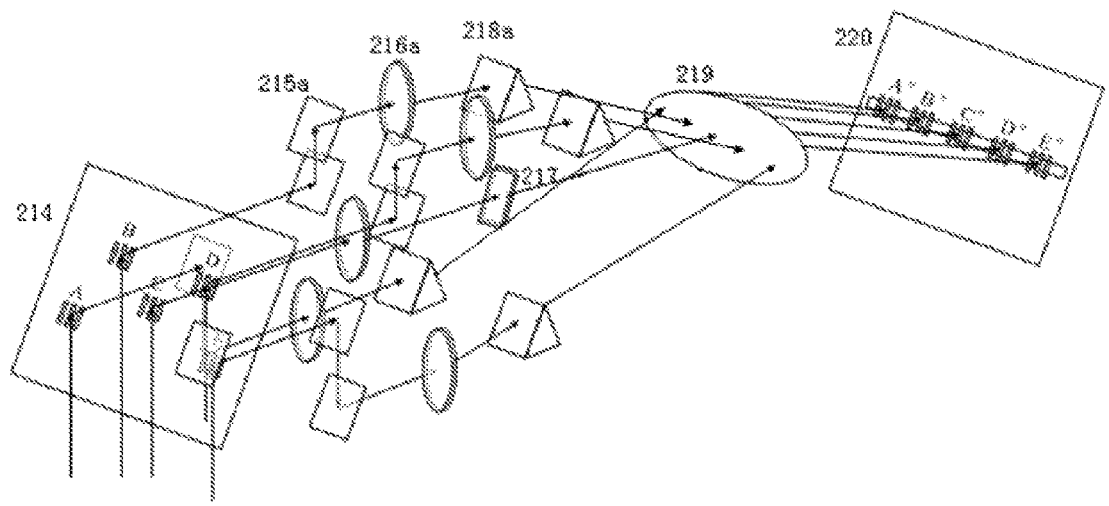
FIG. 4 is a partial view of the refractive unit with a reflector group according to the present invention.

FIG. 3 shows a focusing and leveling apparatus having a refractive unit for use in a focusing and leveling sub-system of a projection photolithography tool, constructed in accordance with Embodiment 1 of the present invention. The apparatus is used for accurate and efficient measurement of the position of a wafer surface. As illustrated, the apparatus comprises an illumination light source 201, an illumination lens group 202, projection slits 203, a double-prism group 204, an upstream projection lens group 205, a projection diaphragm 206, a downstream projection lens group 207, a projection reflector 208, an object 209 being measured, an upstream detection reflector 210, an upstream detection lens group 211, a detection diaphragm 212, a downstream detection lens group 213, a downstream detection reflector 214, a reflector group 215 of the refractive unit, a lens group 216 of the refractive unit, a parallel-sided plate 217, a prism group 218 of the refractive unit, a relay lens group 219, a CCD linear array 220, a focusing controller 221 and an arithmetic unit 222. A light beam from the illumination light source 201 passes through the illumination lens group 202 and is then incident on the projection slits 203 which is sandwiched between the two prisms of the double-prism group 204. After exiting the double-prism group 204, sub-beams are generated and travel through the upstream projection lens group 205, the projection diaphragm 206 and the downstream projection lens group 207, and are then reflected by the projection reflector 208 onto the object 209. The object 209 then reflects the sub-beams onto the upstream detection reflector 210, which, in turn, reflects the sub-beams into the upstream detection lens group 211. After traveling through the upstream detection lens group 211, the sub-beams further propagate through the detection diaphragm 212 and the downstream detection lens group 213, and are then reflected by the downstream detection reflector 214 onto the reflector group 215 (i.e., reflectors 215a-215h). After leaving the reflector group 215, the sub-beams travel through the lens group 216 (i.e., respectively through lens 216a-216e), and then a middle one of the sub-beams passes through the parallel-sided plate 217, with all the rest, peripheral ones of the sub-beams passing through the prism group 218 (i.e., respectively through prisms 218a-218d), wherein mark B corresponds to 215a, 215b, 216a and 218a, mark A to 215c, 215d, 216b and 218b, mark D to 215e, 215f, 216c and 218c, and mark E to 215g, 215h, 216d and 218d. Thereafter, all the sub-beams, including the middle one, transmit through the relay lens group 219 and are received by the CCD linear array 220, where they are subjected to photoelectric conversion and result in information about a level and a tilt of the surface of the object being measured. The information is then transferred by the focusing controller 221 to the arithmetic unit 222, in order to perform control over a wafer stage 223 such that the object 209 is adjusted in its surface level and tilt as desired. While the sub-beams have been illustrated as being incident on the refractive unit in a horizontal orientation in this embodiment, the present invention is not limited to such horizontal incidence in practical applications. The reflector group 215 functions to separate the respective sub-beams, which form respective images after passing through the lens group 216, and are then refracted by the prism group 218 onto the relay lens group 219. Finally, the images formed by the sub-beams appear in a linear arrangement on the CCD linear array 220. FIG. 4 is a partial view of the refractive unit having the reflectors. As shown in the figure, the refractive unit includes the reflector group 215, the lens group 216, the parallel-sided plate 217 and the prism group 218. After the sub-beams are reflected by the reflector group 215, they are incident on and travel through the lens group 216. Upon exiting the lens group 216, the middle one of the sub-beams transmits through the parallel-sided plate 217, and the remaining four peripheral sub-beams all pass through the prism group 218. Thereafter, the peripheral sub-beams, together with the middle sub-beam, pass through the relay lens group 219 and are received by the CCD linear array 220.

Figure 5:
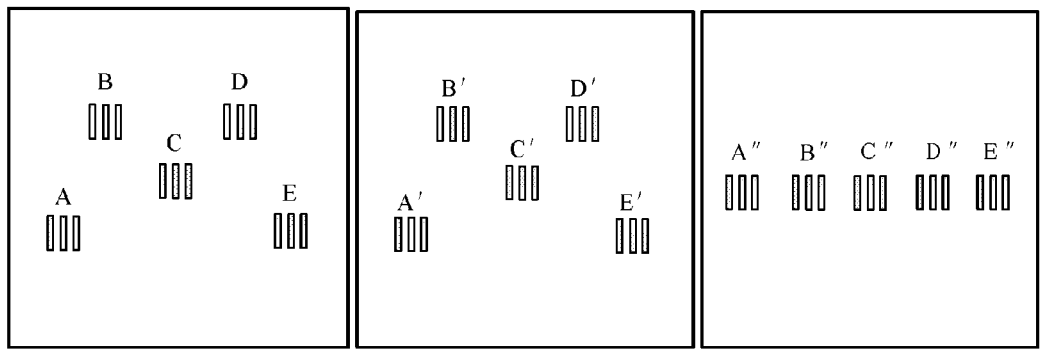
FIG. 5A is a schematic illustrating projection slits in accordance with an embodiment of the present invention.
FIG. 5B shows locations on an image plane where light spots are formed before a light beam passes through the refractive unit in accordance with an embodiment of the present invention.
FIG. 5C shows locations on an image plane where light spots are formed after a light beam has passed through the refractive unit in accordance with an embodiment of the present invention.
Figure 6:
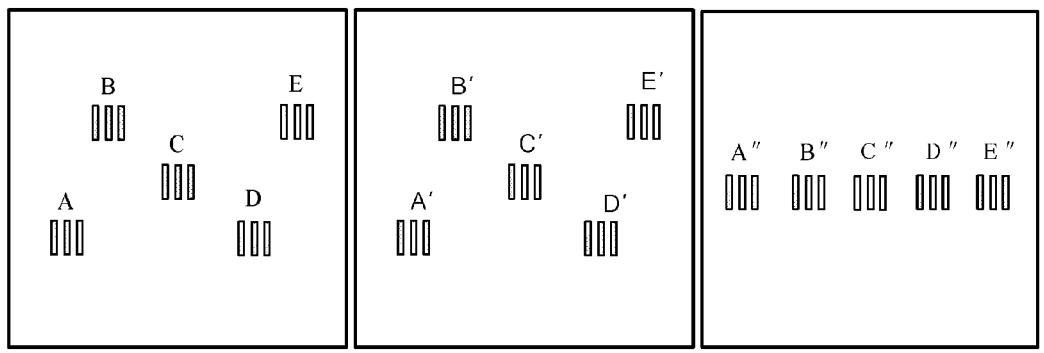
FIG. 6A is a schematic illustrating projection slits in accordance with another embodiment of the present invention.
FIG. 6B shows locations on an image plane where light spots are formed before a light beam passes through the refractive unit in accordance with another embodiment of the present invention.
FIG. 6C shows locations on an image plane where light spots are formed after a light beam has passed through the refractive unit in accordance with another embodiment of the present invention.

FIGS. 5A and 6A show two applicable layouts of the projection slits. In each case, the slits are disposed between the two prisms of the double-prism group 204 in a tilted configuration, and the marks A, B, C, D and E of the projection slits are arranged at the locations indicated in the respective figure. FIGS. 5B and 6B show spatially distributed light spots A', B', C', D' and E' formed on an image plane before the sub-beams pass through the refractive unit in cases of the respective layouts of the projection slits being used. FIGS. 5C and 6C show linearly distributed light spots A", B", C", D" and E" formed on an image plane after the sub-beams have passed through the refractive unit in cases of the respective layouts of the projection slits being used. In each case, the sub-beams finally travel through the relay lens group 219 and are received by the CCD linear array 220, thereby converting the planar distribution of the light spots in the field of view to a desired linear distribution.

Figure 7:
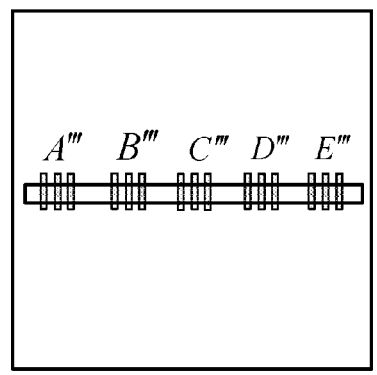
FIG. 7 shows locations on a CCD linear array where light spots are formed by the light beams of FIGS. 5C and 6C.

FIG. 7 shows light spots formed by the sub-beams on the CCD linear array in both of the cases shown in FIGS. 5C and 6C, wherein the light spots appear as linearly arranged patterns A''', B''', C''', D''' and E'''.

Embodiment 2

Figure 8:
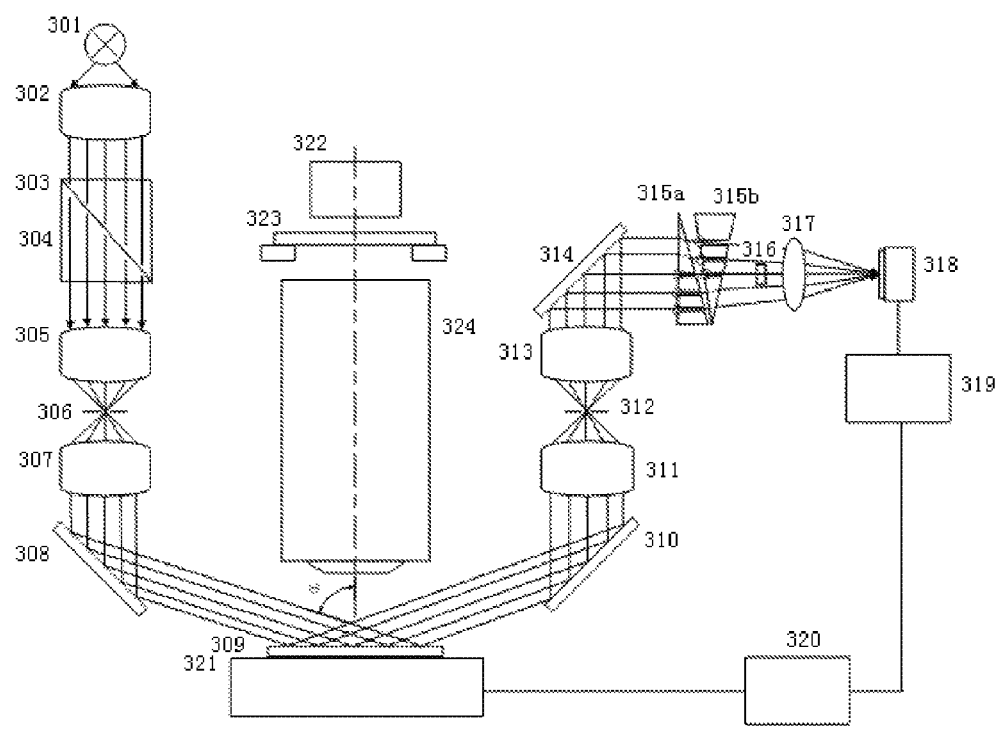
FIG. 8 is a schematic illustrating a focusing and leveling apparatus having a refractive unit with a wedge group according to the present invention.

FIG. 8 is a schematic illustration of a focusing and leveling apparatus having a refractive unit with a wedge group for use in a focusing and leveling sub-system of a projection photolithography tool, constructed in accordance with Embodiment 2 of the present invention. The apparatus is used for accurate and efficient measurement of the position of a wafer surface. As illustrated, the apparatus comprises an illumination light source 301, an illumination lens group 302, projection slits 303, a double-prism group 304, an upstream projection lens group 305, a projection diaphragm 306, a downstream projection lens group 307, a projection reflector 308, an object 309 being measured, an upstream detection reflector 310, an upstream detection lens group 311, a detection diaphragm 312, a downstream detection lens group 313, a downstream detection reflector 314, a wedge group 315 of the refractive unit, a parallel-sided plate 316, a relay lens group 317, a CCD linear array 318, a focusing controller 319 and an arithmetic unit 320. A light beam from the illumination light source 301 passes through the illumination lens group 302 and is then incident on the projection slits 303 which is sandwiched between the two prisms of the double-prism group 304. After exiting the double-prism group 304, sub-beams are generated and travel through the upstream projection lens group 305, the projection diaphragm 306 and the downstream projection lens group 307, and are reflected by the projection reflector 308 onto the object 309. The object 309 subsequently reflects the sub-beams onto the upstream detection reflector 310, which, in turn, reflects the sub-beams into the upstream detection lens group 311. After traveling through the upstream detection lens group 311, the sub-beams further propagate through the detection diaphragm 312 and the downstream detection lens group 313, and are then reflected by the downstream detection reflector 314 into the wedge group 315. After exiting the wedge group 315, a middle one of the sub-beams passes through the parallel-sided plate 316, and then, together with the rest, peripheral ones of the sub-beams, transmits through the relay lens group 317 and is received by the CCD linear array 318, where the sub-beams are subjected to photoelectric conversion and result in information about a level and a tilt of the surface of the object being measured. The information is then transferred by the focusing controller 319 to the arithmetic unit 320, in order to perform control over a wafer stage 321 such that the object 309 is adjusted in its surface level and tilt as desired.

Figure 9:
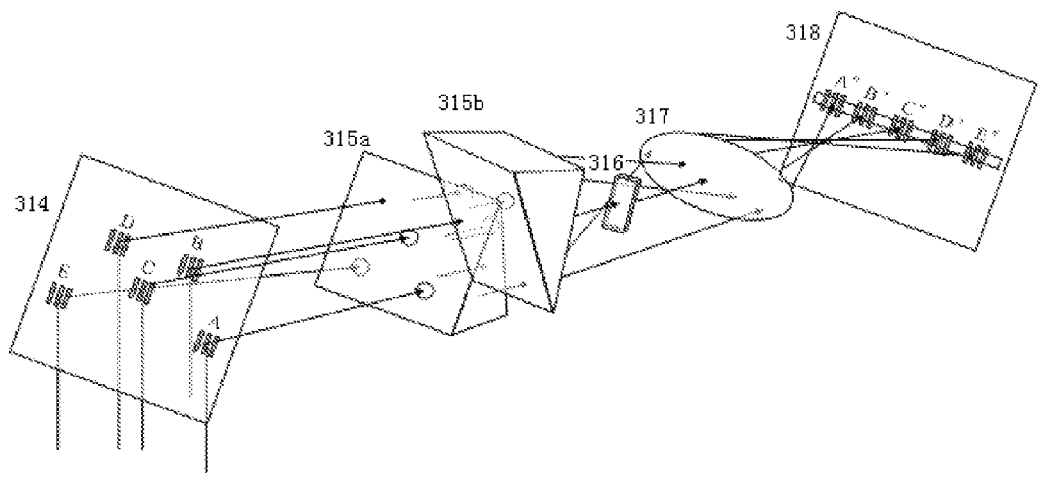
FIG. 9 is a partial view of the refractive unit with a wedge group according to the present invention.

FIG. 9 is a schematic illustration of the refractive unit having the wedge group. As shown in the figure, the refractive unit includes the parallel-sided plate 316 and the wedge group 315. The wedge group 315 is composed of two wedges disposed with their sharp corners opposite to each other. After being reflected by the downstream detection reflector 314, the sub-beams are imaged on a single image plane by the two wedges 315. In the two wedges, the wedge 315a is disposed with its sharp corner oriented in the same direction as the orientation of the marks B and D (i.e., upward), and the sharp corner of the wedge 315b is oriented in the same direction as the orientation of the marks A and E (i.e., downward). The wedge group deflects the sub-beams by an angle given as: $\delta=\alpha$ (n−1), where, n is the index of refraction of the wedges, and $\alpha$ is the angle of the sharp corners thereof which is less than 5°. The sub-beams are incident on a face of the upstream wedge 315a at an angle that is desired to be as near to 90° as possible, and is finally imaged on the CCD linear array 318 by the relay lens group 317. The wedge 315a defines two holes at locations corresponding to the incidence of the lower two of the aforementioned sub-beams, while the wedge 315b defines two holes at locations corresponding to the incidence of the upper two of the sub-beams that have been deflected by the wedge 315a. In addition, each of the wedges 315a and 315b further defines a hole corresponding to the incidence of a middle one of the sub-beams. All of these holes are through-holes without deflecting the sub-beams during their passage therethrough. Further, the parallel-sided plate 316 is disposed to compensate for an optical path difference of the middle sub-beams, such that the planar distribution of the light spots is converted to a desired distribution after the sub-beams have passed through the wedge group 315, and the sub-beams then transmit through the relay lens group 317 and are finally received by the CCD linear array 320.

Disclosed herein are merely several preferred embodiments of the present invention, which are presented only to illustrate rather than limit the invention in any way. Any other technical schemes resulting from logical analysis, inference or limited experimentation by those skilled in the art in light of this inventive concept is considered to fall within the scope of the present invention.

What is claimed is:

1. A focusing and leveling apparatus, comprising: an illumination light source for emanating a light beam; and an illumination lens group, a projecting unit, an object being measured, a detecting unit, a refractive unit, a relay lens group and a photoelectric detector, disposed sequentially in this order in a transmission path of the light beam, the photoelectric detector configured to convert the light beam that has exited the relay lens group and carries information about a level and a tilt of a surface of the object being measured to an electrical signal and pass the electrical signal on to an arithmetic unit and a focusing and leveling controller, the arithmetic unit configured to produce a control signal for the focusing and leveling controller based on the received electrical signal such that the focusing and leveling controller controls a wafer stage that supports the object being measured to adjust the level and tilt of the surface of the object being measured, wherein the projecting unit comprises projection slits defining a plurality of non-linearly arranged marks, such that after passing sequentially through the illumination lens group, the projecting unit, the object being measured and the detecting unit, the light beam emanated by the illumination light source becomes a plurality of non-linearly arranged sub-beams corresponding to the plurality of marks, and wherein the refractive unit is configured such that the plurality of sub-beams form a plurality of linearly arranged light spots after passing through the refractive unit.

2. The apparatus according to claim 1, wherein the projection slits define at least three non-linearly arranged marks.

3. The apparatus according to claim 1, further comprising a double-prism group having two prisms sandwiching the projection slits therebetween.

4. The apparatus according to claim 1, wherein the refractive unit comprises a reflector group, a lens group and a prism group.

5. The apparatus according to claim 4, wherein the reflector group consists of n−1 pairs of reflectors, the lens group consists of n lenses, and the prism group consists of n−1 prisms, where n corresponds to a number of the non-linearly arranged marks defined by the projection slits.

6. The apparatus according to claim 5, wherein: the refractive unit further comprises a parallel-sided plate; a middle one of the plurality of sub-beams incident on the refractive unit passes through a corresponding one of the lenses and is then incident on the parallel-sided plate, and wherein remaining ones of the plurality of sub-beams travel sequentially through corresponding pairs of the reflectors, corresponding ones of the lenses and the prisms, and are then incident, together with the middle sub-beam, on the relay lens group.

7. The apparatus according to claim 1, wherein the photoelectric detector is a single CCD linear array.

8. The apparatus according to claim 1, wherein the refractive unit comprises two wedges disposed with sloped faces thereof facing each other.

9. The apparatus according to claim 8, wherein a first one of the two wedges defines first through-holes in middle and lower parts thereof at locations corresponding to incidence of a middle one and lower ones of the plurality of sub-beams on the first one of the two wedges of the refractive unit, and wherein a second one of the two wedges defines second through-holes in middle and upper parts thereof at locations corresponding to incidence of the middle one and upper ones of the plurality of sub-beams on the second one of the two wedges of the refractive unit.

10. The apparatus according to claim 9, wherein the refractive unit further comprises a parallel-sided plate arranged such that the middle one of the plurality of sub-beams passes through the first and second through-holes defined in the respective middle parts of the two wedges and is then incident on the parallel-sided plate.

* * * * *